United States Patent [19]
Yamagata et al.

[11] Patent Number: 5,244,554
[45] Date of Patent: Sep. 14, 1993

[54] METHOD OF PRODUCING RECORDING MEDIA AND ITS APPARATUS

[75] Inventors: Noriaki Yamagata; Nobuyuki Yoshino, both of Shibukawa; Shuichi Hirai, Machida, all of Japan

[73] Assignee: Denki Kagaku Kogyo Kabushiki Kaisha, Tokyo, Japan

[21] Appl. No.: 716,927

[22] Filed: Jun. 18, 1991

[30] Foreign Application Priority Data

Jun. 18, 1990 [JP] Japan .................................. 2-159433

[51] Int. Cl.$^5$ .............................................. C23C 14/34
[52] U.S. Cl. ............................ 204/192.2; 204/192.16; 204/192.15; 204/298.25; 204/298.35; 156/345
[58] Field of Search ...................... 204/192.12, 192.15, 204/192.16, 192.2, 192.3, 192.32, 298.25, 298.26, 298.31, 298.33, 298.35; 156/345, 643, 646

[56] References Cited

U.S. PATENT DOCUMENTS

| | | | |
|---|---|---|---|
| 4,384,938 | 5/1983 | Desilets et al. ................. | 204/298.33 |
| 4,474,659 | 10/1984 | Fazlin ......................... | 204/298.33 X |
| 4,500,407 | 2/1985 | Boys et al. ..................... | 204/298.25 |
| 4,595,481 | 6/1986 | Allen et al. ..................... | 204/298 |
| 4,595,484 | 6/1986 | Giammarco et al. ........... | 204/298.33 |
| 4,601,807 | 7/1986 | Lo et al. ........................ | 204/298.33 |
| 4,620,893 | 11/1986 | Parrens ....................... | 204/298.33 X |
| 4,663,009 | 5/1987 | Bloomquist et al. ........ | 204/298.25 X |
| 4,749,465 | 6/1988 | Flint et al. .................... | 204/298.25 |
| 4,767,648 | 8/1988 | Kieser et al. ................. | 204/298.33 X |
| 4,786,564 | 11/1988 | Chen et al. .................... | 204/192.2 X |
| 4,894,133 | 1/1990 | Hedgcoth ..................... | 204/298.26 X |

FOREIGN PATENT DOCUMENTS 58-77239 5/1983 Japan .
59-50179 3/1984 Japan .

*Primary Examiner*—Nam X. Nguyen
*Attorney, Agent, or Firm*—Oblon, Spivak, McClelland, Maier & Neustadt

[57] ABSTRACT

A method of producing recording media which comprises steps of arranging substrates for recording media on a carrier which is purified by etching with a plasma state gas; and forming a plurality of sputtered layers on the substrates.

An apparatus for producing recording media which comprises a sputtering chamber which forms a recording layer; and a treatment chamber which precedes the sputtering chamber, and in which a carrier to be arranged with substrates for the recording media is purified by a plasma state gas.

11 Claims, 3 Drawing Sheets

METHOD OF PRODUCING RECORDING MEDIA AND ITS APPARATUS

BACKGROUND OF THE INVENTION

1. Field of the Invention

This invention relates to a method of producing recording media having high recording density and high coercivity and its apparatus.

2. Discussion of the Background

In recent times, with increase of information quantity, request for recording media having high recording density has increased, and developments of magnetic recording media, optical recording media, magneto-optic recording media having magnetic thin film alloy by sputtering method continues.

Conventionally, in producing magnetic recording media by sputtering, chromium sublayer is formed on a substrate for recording media (hereinafter substrate), and a magnetic layer is formed on the sublayer by sputtering magnetic alloy such as Co-Ni-Cr. One sputtering method is called the stationary opposing type in which a disk-like target and a substrate are disposed with those centers aligned, and one method is called The passing by type or in-line type in which a magnetic film is sputtered on the substrate while a carrier arranged with many substrates passes between the targets.

In either production method, it is necessary to strictly control sputtering conditions such as temperature of the substrate or pressure, and it is important to produce them in a clean atmosphere, preventing contamination by impurities from the device or from jigs. Especially the detrimental influence of the impurity adhered to the jigs, is significant.

Conventionally, with respect to contamination, no consideration is particularly given. Accordingly since, during the sputtering of chromium sublayer, magnetic layer, and protection layer, the respective sputtering particles are adhered to the jigs, for instance, a carrier arranged with substrates, when these jigs are recycled, the sputtering particles adhered to the jig and the impurity adhered to these sputtering particles are separated into the atmosphere in the respective sputtering processes, and mixed into the magnetic recording media as impurities.

As mentioned above, the sputtered particles adhered to the carrier of substrates and the impurities adhered to the sputtered particles are detrimental to magnetic properties, and in particular, to the coercivity of the magnetic recording media.

SUMMARY OF THE INVENTION

It is an object of the present invention to provide a method of producing recording media, and an apparatus capable of removing impurities adhered to jigs, and above all, a carrier of substrates preventing the impurities from being included in the recording media, production of the carrier, and production of recording media having high coercive force and excellent recording property.

The inventors, to achieve the purpose, have made an intensive study on a method of removing impurities adhered to the carrier arranged with substrates. As a result, the inventors found a magnetic recording media having high coercivity and excellent in recording property is obtained by arranging substrates on a carrier which is purified by etching with a plasma state gas. (hereinafter etching by a plasma state gas is called plasma etching).

This invention provides the following:

1. A method of producing recording media in which substrates for recording media are arranged on the carrier which has been purified by etching with a plasma state gas, and sputtering layers onto the substrates.
2. An apparatus for producing recording media which is composed of at least a sputtering chamber for forming the recording media, and a treatment chamber for purifying the carrier for substrates, using a plasma state gas before the sputtering.
3. An etching treatment device having a treatment chamber for purifying the carrier using plasma state gas, having an intake hole and an exhaust hole, and electrodes which are electrically insulated from the walls of the treatment chamber, for applying an electric voltage between the walls and the carrier.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
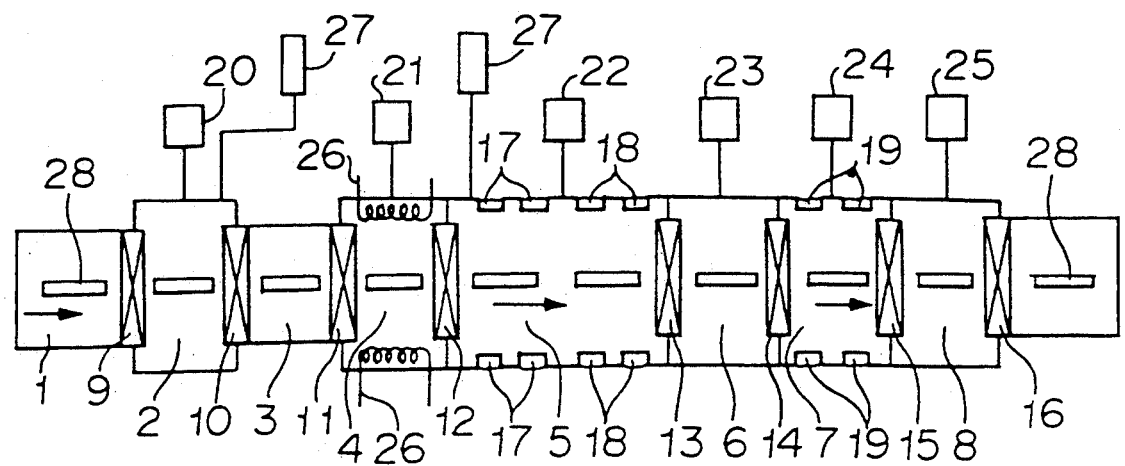
FIG. 1 is a sectional top view showing an embodiment of the device according to the invention.

In the drawings, a numeral 1 designates a substrate removal chamber, 2, an etching chamber, 3, a substrate arranging chamber, 4, a heating chamber, 5, a sublayer and magnetic layer sputtering chamber, 6, a separation chamber, 7, a protection layer sputtering chamber, 8, a removal chamber, 9 to 16, gates, 17, a target for sputtering sublayer, 18, a target for sputtering magnetic layer, 19, a target for sputtering protection layer, 20 to 25, cryopumps, 26, a heater, 27, a differential exhaust device, 28, a carrier, 29, substrate arranging portion, 30, a treatment chamber, 31, a gas intake pipe, 32, a gas distribution pipe, 33, a gas exhaust pipe, 34, an electrode for carrier, 35, a gate, 36, an opposing electrode, 37, a carrier conveyor, 38, a rail for carrier conveyor, 39, a driving device for carrier conveyor, 40, a ceramic insulation material.

DETAILED DESCRIPTION OF PREFERRED EMBODIMENTS

Detailed explanation will be given on the present invention, by taking examples of magnetic recording media.

In producing recording media by arranging substrates on a carrier of the substrates, and by sputtering a sublayer, a magnetic layer, and a protection layer on the substrates, continuously or semicontinuously, conventionally, the carrier of the substrates utilizes, as its material, aluminum, aluminum alloy, stainless steel, ceramic such as alumina, and heat resistant resin such as polyimide. When substrates are arranged on a carrier which is not purified by a plasma etching treatment, and which is iteratively used in the production of the magnetic recording media by forming a chromium sublayer, a Co-Cr-Ni magnetic layer, and a carbon protective layer sputtered on the substrates, with increase of the number of the usage of the carrier, the magnetic property of the media is lowered. The inventor investigated the cause, and as a result, water molecule which is adhered to carbon of the protective layer is found to be the most influential factor. Chromium sublayer, magnetic layer of $CoNi_{30}Cr_{7.5}$, and carbon protection layer are formed on an aluminum alloy plate by successively sputtering these layers, and samples are made having films shown in Table 1. These samples are placed in a vacuum chamber, and the degassing quantity thereof is measured, as well as the kind of the gas are measured by a quadrapole mass filter.

TABLE 1

| | Substrate temperature (°C.) | Film thickness (Å) | Degassing quantity composition of film | | |
|---|---|---|---|---|---|
| | | | Cr + Co | Cr + Co + C | Cr + Co + C + Cr + Co |
| 1 | 200 | 300 | 1.5 | 5.0 | 3.0 |
| 2 | 200 | 2000 | 1.5 | 10.0 | 5.0 |
| 3 | 250 | 300 | 2.1 | 9.0 | 5.0 |
| 4 | 250 | 2000 | 2.1 | 11.0 | 4.0 |

In Table 1, the unit of degassing quantity is $\times 10^{-5}$ torr·l/sec. Co signifies an alloy having an atomic percentage of $CoNi_{30}Cr_{7.5}$. $Cr+Co+C+Cr+Co$ signifies that Co, C, Cr, and Co are successively formed on Cr.

As shown in Table 1, in case of the sample in which the outermost layer is formed of carbon, the degassing quantity of the film may reach about three times as large as that in the case wherein the sample has only chromium sublayer and cobalt alloy layer. As the result of a mass spectroscopy, the gas contains more than 80% of water. Accordingly, it is found that by removing the impurity particles, above all, carbon adhered by sputtering, by a plasma etching, the adhesion of water molecule is prevented, and the undesirable influence on the magnetic property can be extinguished.

Accordingly, when a magnetic recording media is produced by forming a chromium sublayer, a magnetic layer and a carbon protective layer on substrates for magnetic recording media by sputtering, components constituting the respective layers are adhered to the carrier arranged with the substrates, and impurities such as $H_2O$ are also adhered to them. When the carrier is iteratively used, these adhered or adsorbed substances are taken into the magnetic recording media as impurities.

Since it is necessary to produce the magnetic recording media in a clean atmosphere, it is not possible to adopt methods such as mechanical polishing or blasting which are conventionally carried out, to remove impurities adhered or adsorbed on the carrier, and to purify the carrier. This invention is a method of producing recording media and its apparatus in which sputtered layers are formed on a substrate by arranging the substrate on a carrier which is purified by etching with a plasma state gas, by which recording media having excellent recording property is produced.

As a gas for the plasma etching, argon, nitrogen, and oxygen, and the mixtures of these gases are desirable. However gasses such as $CF_4$ and $CCl_2$ can be utilized. The pressure of the plasma etching gas is disirable to be in the range of $10^{-3}$ to $10^{-2}$. However in case of argon, the pressure range of 0.01 to 0.1 torr is desirable, in case of argon+oxygen, 0.05 to 0.5 torr, and in case of oxygen, 0.1 to 5 torr. Compared with inert gas such as argon, in case of a reactive gas, the higher the pressure the better. When the etching gas pressure is lower than the above, electric discharge is unstable, whereas when the etching gas pressure is higher than the above, etching efficiency is worsened. The power source generating the plasma state gas to perform the plasma etching, may be of high frequency current, or of alternative current, or of direct current. The voltage is desirable to be in the range of 200 to 800 V in alternative current, and 300 to 1,000 V for direct current. The electric current density is desirable to be in the range of 0.2 to 5 $W/cm^2$. When the voltage and the electric current density are below the above ranges, the electric discharge is unstable, whereas when higher than the above range, undesirable heat generation of the carrier and the lowering of the etching efficiency take place. When the etching of the carrier is performed every time before the sputtering, the effect is the most significant. However this can be performed with a sufficient effect even after the repeated usage of the carrier by several times to several tens times.

EXAMPLES

The following Examples are shown, by which the present invention will completely be explained.

EXAMPLE 1

Figure 2:
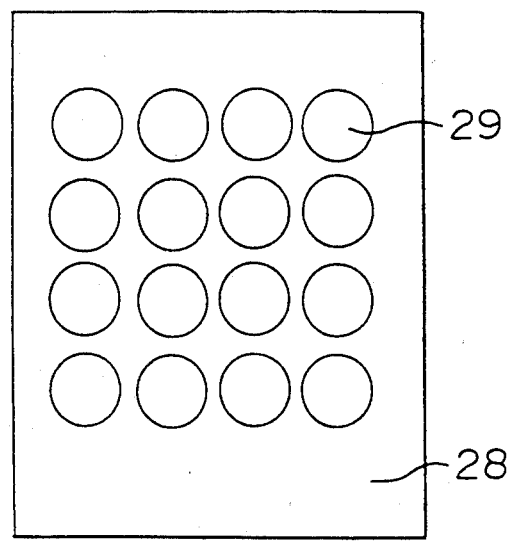
FIG. 2 is a total view showing and embodiment of a carrier.
Figure 3:
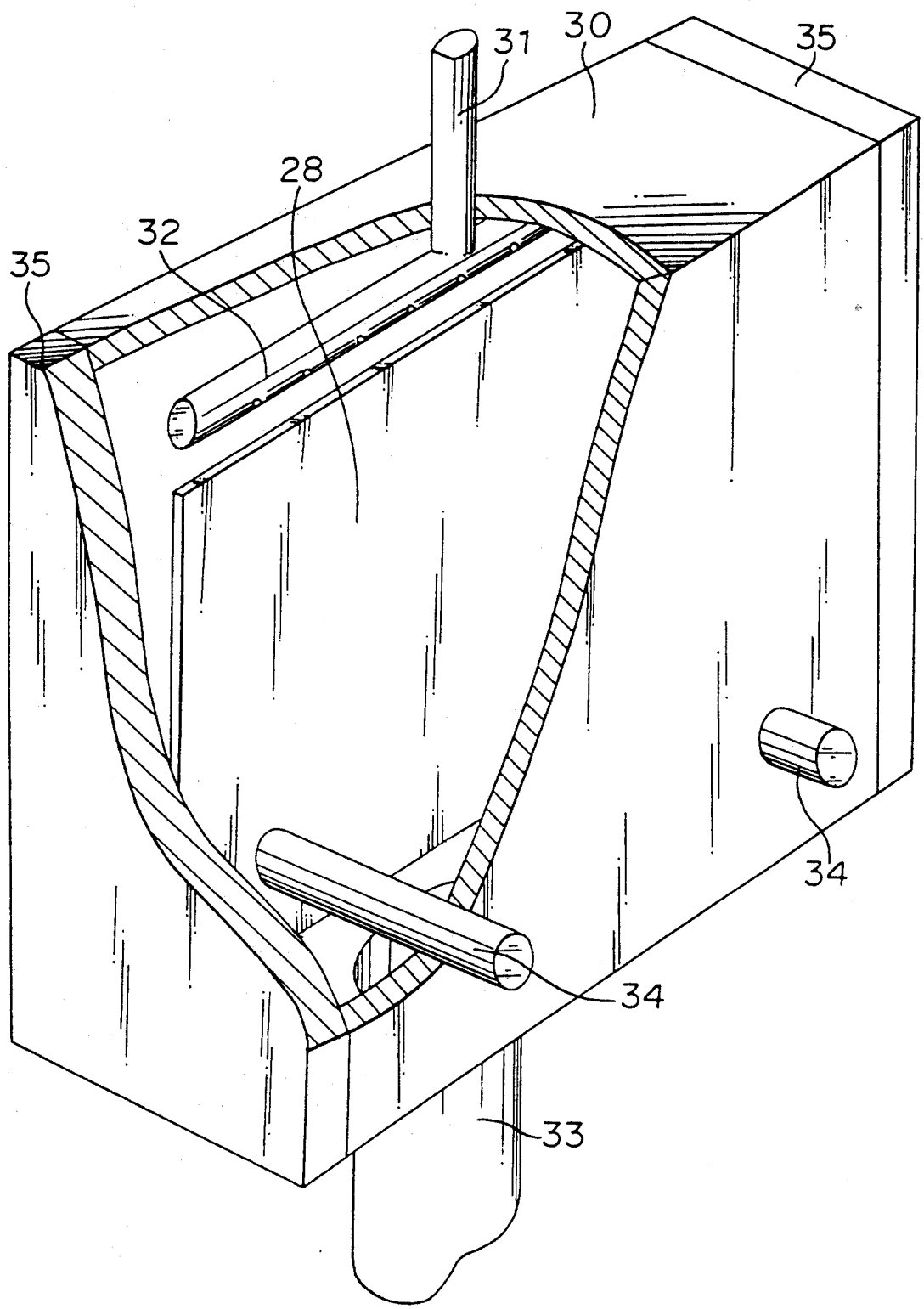
FIG. 3 is a perspective view showing an embodiment of an etching treatment device according the invention.
Figure 4:
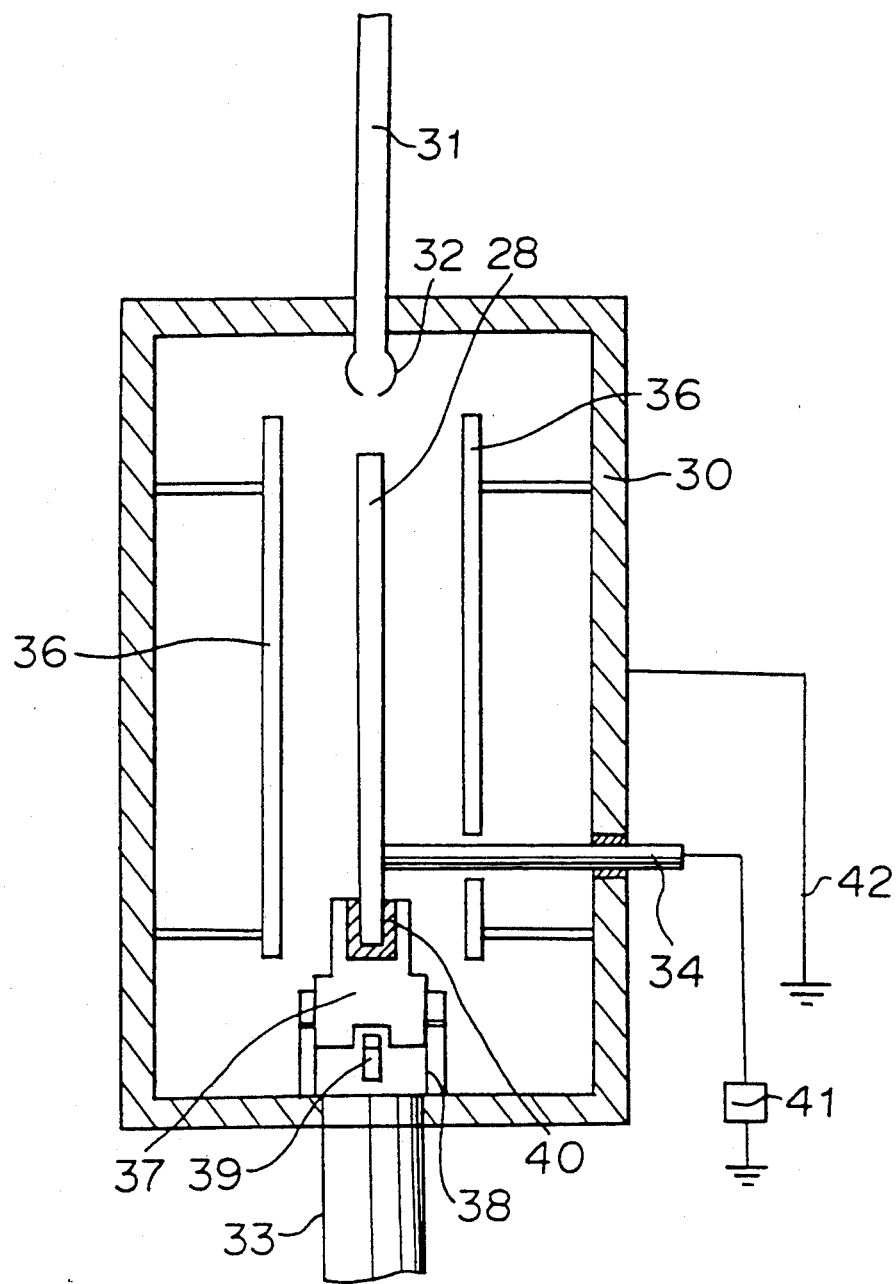
FIG. 4 is a longitudinal sectional view of an embodiment of an etching treatment device according to the present invention.

FIG. 1 is a sectional top view of an embodiment of the device according to the present invention. FIG. 2 is a total view showing an embodiment of the carrier according to the present invention. FIG. 3 is a perspective view showing an embodiment of the etching treatment device according to invention. FIG. 4 is a longitudinal side view showing an embodiment of an etching treatment device according to the present invention.

Substrates are arranged at a plurality of substrate arranging portions of the carrier 28. Sputtering is performed. The carrier is repeatedly utilized. In the substrate removal chamber 1, the magnetic recording media which is finished with all the processes, is removed from the carrier. The carrier is transferred to the etching chamber 2 by opening the entrance gate 9 of the etching chamber 2, and then the gate is closed.

The etching chamber 2 is a treatment device composed of the structure as shown in FIGS. 3 and 4. The pressure of the atmosphere of the device is controlled to 0.02 torr, by supplying argon gas in very small quantity through the gas intake pipe 31, and by exhausting the gas through the exhaust pipe 33 by the cryopump 20. A high frequency power source is utilized at an ambient temperature, which generates an output of 350 V in voltage and 0.3 $W/cm^2$ in current density, and argon plasma etching is performed. After that the outlet gate 10 is opened and the carrier is moved to the substrate arranging chamber 3. In this chamber, 16 Ni-P plate aluminum alloy substrates (outer diameter 95 mm, inner diameter 25 mm, thickness 1.3 mm) are arranged on the substrate arranging portions 29 of the carrier. This carrier is transferred to the heating room 4, by opening the entrance gate 11. After the gate 11 is closed, the pressure of the chamber is controlled to $10^{-5}$ torr by the cryopump 21, the temperature of the chamber is controlled to 300° C. by the heater 26, and substrates are heated for one minute.

Hereinafter, the charging and the removal of the carrier to and from the respective chambers and the pressure of these chambers are successively controlled as in the operation of the heating chamber 4, in the following condition. In the sputtering chamber 5, the pressure is controlled to $2\times10^{-3}$ torr, the chromium sublayer is formed by sputtering for one minute. The magnetic layer of $CoNi_{30}Cr_{7.5}$ (atomic percentage) is formed on the sublayer by sputtering for one minute. In the separation chamber 6, the pressure is controlled to $1\times10^{-5}$ torr, and the substrates stay for one minute, by which the mutual influence of this sputtering particles of the sputtering chamber 5 and the protective layer sputtering chamber 7, are shut off. In the protective layer sputtering chamber 7, the pressure is controlled to $5\times10^{-3}$ torr, the temperature of the chamber is controlled to 100° C. and the substrates are sputtered with a carbon protection layer for one minute. The gate 15 is opened, and the carrier is transferred to the removal chamber 8. The carrier is transferred to the substrate removal chamber 1, and the magnetic recording media are obtained. The carrier is repeatedly utilized through whole of the processes. After the carrier is utilized for 20, 40, 60, and 80 times, the partial pressure of the impurity gas from the carrier and the coercivity of the magnetic recording media obtained this time, are measured. The measurement result is shown in Table 2. The impurity gas pressure from the carrier is measured by a quadrapole mass filter, by placing the carrier which is not arranged with the substrates, in the etching chamber, and by exhausting the impurity gas by the differential exhaust device 27. The coercivity is measured by using a sample oscillation type magnetic force meter. As a result, even after the utilization of the carrier by 80 times, the impurity gas partial pressure is as low as $0.90\times10^{-5}$ torr, and the coercivity of the magnetic recording media is as high as 1,060 oersted (Oe), which is comparable to those obtained at the initial stage of operation.

As mentioned before, the etching treatment device which is the etching chamber, has the structure as shown in FIGS. 3 and 4. The details will be explained in the followings.

In FIGS. 3 and 4, the treatment chamber 30 is made of stainless steel. In front and rear of the chamber, the chamber has gates 35 which open and close when the carrier is transferred in and transferred out. At the upper side of the chamber, the gas distribution pipe 32 is installed, which is connected to the intake pipe 31 for the gas for the plasma etching. At the bottom side of the chamber, the gas exhaust gas 33 is connected. The carrier 28 is placed at the center of the chamber. The electrode 34 is connected to the carrier, which applies a voltage between the walls of the treatment chamber and the carrier. This electrode is extended to the outside of the chamber and is connected to the power source 41, being insulated with the walls of the treatment chamber. As shown in FIG. 4, the walls of the treatment chamber are grounded by ground 42. The opposing electrode 36 which is grounded to the walls of the treatment chamber, is installed opposing to the carrier 28. The carrier 28 is attached to the carrier conveyor 37 through the ceramic insulation material 40. This carrier conveyor is transferred on the rail 38, by the driving device 39, which enables transferring in and transferring out of the carrier to the inside or to the outside of the etching chamber.

TABLE 2

| Iteration No. of usage | | 20 | 40 | 60 | 80 |
|---|---|---|---|---|---|
| Coercivity Hc(Oe) | Example 1 | 1100 | 1100 | 1090 | 1060 |
| | Example 2 | 1100 | 1100 | 1080 | 1050 |
| | Example 3 | 1100 | 1100 | 1090 | 1070 |
| | Comparative Example | 1100 | 1070 | 1020 | 900 |
| Impurity gas pressure ($\times 10^{-5}$ torr) | Example 1 | 0.80 | 0.84 | 0.88 | 0.90 |
| | Example 2 | 0.82 | 0.87 | 0.89 | 0.92 |
| | Example 3 | 0.82 | 0.86 | 0.88 | 0.89 |
| | Comparative Example | 0.95 | 1.70 | 2.50 | 5.30 |

EXAMPLES 2 AND 3

The magnetic recording media is produced by the same condition as in Example 1 except the power source and that the kind, the pressure, and the temperature of the atmospheric gas in the device, and the treatment time are changed as shown in Table 3. In Example 2, voltage of 500 V is supplied by an alternative power source. In Example 3, voltage of 600 V is supplied by a direct power source. After the substrates are produced for 20, 40, 60, and 80 times, the impurity gas pressure from the carrier and the coercivity of the magnetic recording media obtained at that time are measured by the same measurement method with those in Example 1. As a result, as shown in Table 2, the impurity gas pressure from the carrier is low, and the coercivity of the recording media is high.

COMPARATIVE EXAMPLE

Magnetic recording media are produced in which the sputtering is performed in the same condition with Example 1 except that argon is utilized as an atmospheric gas in the device, and the etching treatment of the carrier is not performed. After substrates are produced for 20, 40, 60, and 80 times, the impurity gas pressure from the carrier and coercivity of the magnetic recording media obtained at that time is measured by the measurement methods which are the same with those in Example 1. As the result, as shown in Table 2, the impurity gas pressure from the carrier after 80 times production, is $5.3\times10^{-5}$ torr, which is about 6 times as much as that in the former Examples, and the coercive force of the magnetic recording media obtained at that time is 900 oersted (Oe) which is inferior to that in the case of the former Examples. The kind of the impurity gas is analyzed by the quadrapole mass filter. As the result, as shown in Table 4, the composition of the water molecule having mass of 18 g is more than 80%.

TABLE 3

| Examples | 1 | 2 | 3 |
|---|---|---|---|
| Kind of etching gas | Ar | Ar + $O_2$ (1:1) | $O_2$ |
| Pressure of etching gas (torr) | 0.02 | 0.1 | 0.5 |
| Temperature | Ambient | Ambient | Ambient |
| Treatment time (min.) | 0.5 | 0.5 | 1 |

TABLE 4

| Mass No. | Atom No. | Ratio of inclusion |
|---|---|---|
| 2 | $3.2\times10^{-9}$ | 2.4 |
| 4 | $2.4\times10^{-13}$ | 0 |
| 16 | $5.1\times10^{-9}$ | 5.0 |

TABLE 4-continued

| Mass No. | Atom No. | Ratio of inclusion |
|---|---|---|
| 18 | $8.3 \times 10^{-8}$ | 81.3 |
| 28 | $1.1 \times 10^{-8}$ | 8.9 |
| 32 | $5.2 \times 10^{-10}$ | 0 |
| 44 | $3.8 \times 10^{-9}$ | 2.4 |

According to the present invention, the plasma etching treatment can effectively and easily be performed. By using the carrier purified by this method, the influence of the impurity adhered to the carrier, particularly water can be removed, by which magnetic recording media having exllent magnetic properties are stably produced.

What is claimed is:

1. A method of producing recording media which comprises steps of:
    subjecting a substrate carrier in a plasma processing system containing a plasma to a plasma etching when the substrate carrier does not carry any substrates;
    arranging substrates for recording media on the substrate carrier; and
    forming a plurality of sputtered layers on the substrates.

2. The method of producing recording media according to claim 1, wherein the step of subjecting comprises introducing a gas selected from at least one member of the group consisting of argon, oxygen, nitrogen, carbon tetrachloride, and air, into a chamber in which the substrate carrier is subjected to a plasma.

3. The method of producing recording media according to claim 1, wherein the plasma is in a treatment chamber having a pressure between $10^2$ and $10^{-3}$ Torr, further comprising the step of flowing the plasma through the treatment chamber.

4. The method of producing recording media according to claim 1, wherein the plasma is generated by an alternative current power source having a voltage of 200 to 800 V, or by a direct current power source having a voltage of 300 to 1,000 V.

5. The method of producing recording media according to claim 1, wherein the plasma is generated by an output of an electric current with an electric current density of 0.2 to 5 W/cm$^2$, using a high frequency power source.

6. The method of producing recording media according to claim 1, wherein the carrier is purified by the plasma so that an impurity the major components of which are carbon and water, is removed from the carrier.

7. A method of producing recording media which comprises the steps of:
    transferring an unloaded substrate carrier for magnetic recording media to an etching chamber;
    sealing the etching chamber;
    purifying the substrate carrier by generating a plasma in the etching chamber;
    transferring the substrate carrier out of the etching chamber;
    arranging substrates for magnetic recording media on the substrate carrier;
    transferring the substrate carrier arranged with the substrates to a heating chamber and heating the substrate carrier in the heating chamber;
    transferring the substrate carrier arranged with the substrates into a first sputtering chamber and sputter coating the substrates whereby a sublayer and a magnetic layer are successively formed on the substrates;
    transferring the substrate carrier arranged with the substrates to a separation chamber;
    sealing the separation chamber from the first sputtering chamber;
    transferring the substrate carrier arranged with the substrates to a second sputtering chamber and sputter coating therein a sputtered protective layer on the sputtered magnetic layer of the substrates, thereby forming magnetic recording media;
    removing the magnetic recording media from the substrate carrier; and
    repeating, in the same order, the above steps.

8. An etching treatment device for purifying a substrate carrier with a plasma and adapted to be incorporated in an apparatus for producing recording media which comprises;
    a gas intake pipe for a plasma;
    a gas exhaust pipe for the plasma;
    an etching chamber having etching chamber walls which enclose the etching treatment device, the gas intake pipe and the gas exhaust pipe being connected to the etching chamber; and
    wall electrodes connected to the etching chamber walls, and carrier electrodes connected to the substrate carrier which are electrically insulated with the walls, means for applying an electric voltage between the walls and the substrate carrier; and
    means for loading substrates onto the substrate carrier, said means for loading disposed between the etching chamber and a deposition chamber.

9. The etching treatment device according to claim 8, wherein the electrodes which apply an electric voltage between the walls and the substrate carrier for carrying the substrates for recording media, are composed of a first electrode connected to the substrate carrier and a second electrode connected to the walls, which is provided opposing to the first electrode.

10. The etching treatment device according to claim 8, wherein the walls are electrically insulated with the substrate carrier by a ceramic material.

11. The etching treatment device according to claim 8, wherein a distribution pipe is provided, which possesses a great number of gas flowing holes connected to a supply pipe of gases for generating a plasma, and an exhaust pipe opposing the distribution pipe.

* * * * *